United States Patent [19]

Inoue et al.

[11] Patent Number: 5,717,232
[45] Date of Patent: Feb. 10, 1998

[54] SEMICONDUCTOR DEVICE SEALED WITH MOLDED RESIN

[75] Inventors: Kazuhiko Inoue; Souichi Imamura; Masanori Ochi, all of Yokohama; Shigehiro Hosoi, Kawasaki; Toru Suga; Takashi Kimura, both of Yokohama, all of Japan

[73] Assignee: Kabushiki Kaisha Toshiba, Kawasaki, Japan

[21] Appl. No.: 632,836

[22] Filed: Apr. 16, 1996

Related U.S. Application Data

[63] Continuation of Ser. No. 280,615, Jul. 26, 1994, abandoned.

[30] Foreign Application Priority Data

Jul. 27, 1993 [JP] Japan ................................. 5-185057
Apr. 26, 1994 [JP] Japan ................................. 6-088118

[51] Int. Cl.⁶ .......................... H01L 29/80; H01L 23/58; H01L 3/29
[52] U.S. Cl. .......................... 257/283; 257/790; 257/792; 257/635; 257/642
[58] Field of Search ......................... 257/283, 790, 257/792, 642, 635, 684

[56] References Cited

U.S. PATENT DOCUMENTS

| | | | |
|---|---|---|---|
| 4,679,311 | 7/1987 | Lakhani et al. | 257/283 |
| 4,829,347 | 5/1989 | Cheng et al. | 257/283 |
| 4,845,534 | 7/1989 | Fukuta | 257/283 |
| 4,977,100 | 12/1990 | Shimura | 257/283 |
| 5,276,414 | 1/1994 | Fujimoto et al. | 257/790 |

FOREIGN PATENT DOCUMENTS

| | | | |
|---|---|---|---|
| 58-43541 | 3/1983 | Japan | 257/792 |
| 61-190985 | 8/1986 | Japan . | |
| 63-213372 | 9/1988 | Japan . | |
| 63-308323 | 12/1988 | Japan | 257/642 |
| 1069039 | 3/1989 | Japan | 257/792 |
| 2-168652 | 6/1990 | Japan . | |
| 3-124052 | 5/1991 | Japan . | |
| 3-151657 | 6/1991 | Japan . | |
| 5-259336 | 10/1993 | Japan . | |

OTHER PUBLICATIONS

"Electronic Packaging & Interconnection Handbook", pp. 1.16 and 1.36; C. Harper.

*Primary Examiner*—Mahshid D. Saadat
*Assistant Examiner*—Jhihan B. Clark
*Attorney, Agent, or Firm*—Oblon, Spivak, McClelland, Maier & Neustadt, P.C.

[57] ABSTRACT

A semiconductor device has an active layer formed on a semiconductor substrate with different types of junctions, a source region, a drain region, a T-shaped gate electrode in which the cross-sectional area of the upper surface is larger than that of the lower surface, a first dielectric layer covering at least the exposed surface of the active layer, and the gate electrode, and a second dielectric layer enclosing the first dielectric layer. In the device, when the specific inductive capacities of the first and second dielectric layers are $\epsilon(1)$ and $\epsilon(2)$ respectively $\epsilon(1)<\epsilon(2)$ and the water absorption ratio of the first dielectric layer is greater than the water absorption ratio of the second dielectric layer.

13 Claims, 5 Drawing Sheets

CONVENTIONAL EXAMPLE (20 SAMPLES)

PRESENT INVENTION (20 SAMPLES)

SEMICONDUCTOR DEVICE SEALED WITH MOLDED RESIN

This application is a Continuation of application Ser. No. 08/280,615, filed on Jul. 26, 1994, now abandoned.

BACKGROUND OF THE INVENTION

1. Field of the Invention

The present invention relates to a semiconductor device, and, in particular, to a semiconductor device sealed with a molded resin for use in an ultrahigh frequency band, which can be fabricated at low cost, and which exhibits low deterioration of chip performance and high reliability.

2. Description of the Prior Art

FIG. 1 is a sectional view showing the structure of a conventional semiconductor device (first conventional example).

In a semiconductor device used for ultrahigh frequency amplification and the like, for example, in a semiconductor chip of an electric field effect type (including an HEMT), a fine line gate electrode (hereinafter referred to as a gate fine line) is formed between a drain electrode and a source electrode for providing performance with improved noise characteristics (NF) and increased gain (Ga) or the like. Specifically, it is required to be more than 0.55 dB in the noise characteristics (NF).

Normally, this semiconductor chip is enclosed in an enclosure device (ceramic sealing cap) 112 with a ceramic base, for outputting the above-mentioned NF characteristics, Ga characteristics, and the like, at good efficiency. This is referred to as a ceramic seal.

In this method both the upper surface and the lower surface of the chip are covered with a sealing gas, for example, nitrogen gas, which is a so-called air seal. This sealing gas has a specific inductive capacity ($\epsilon$) of "1" and the tangent of the dielectric loss angle (tan $\delta$) is almost zero. Because this gas is an ideal dielectric with no power loss at high frequency, the ceramic sealing is the most common method used to minimize the deterioration of performance of the semiconductor element in high frequency service.

However, in this method the cost of part materials is high, and an inspection of the cap seal and gas density is required. For this reason, there is the drawback that the manufacturing costs are high because the production efficiency is low.

Molded sealing is used as a countermeasure for the problem areas of this first conventional example, for example, as a countermeasure for the high cost of members.

FIG. 3 is an expanded sectional view showing the vicinity of a gate fine line 105 for a second conventional example of the semiconductor device of the present invention of a structure which uses this molded sealing, illustrated in sectional view in FIG. 2.

In the method used to fabricate this second conventional example there is the problem that, because the gate fine line 105 is normally formed on the chip surface, a sealing member, for example, a projection of quartz glass, which is blended with an epoxy resin 108, as shown in FIGS. 1 and 2, specifically, a filler, contacts the surface of the chip so that mechanical damage is caused to the gate fine line 105. The chip is covered with a dielectric layer 106 such as a nitride layer or an oxidized layer or the like, for example, the SiN layer 106 shown in FIGS. 2 and 3 to protect the chip from such damage.

In addition, the thickness of the dielectric layer 106 is set at 5000 Å or greater to maintain the proper degree of protection. However, in the above-mentioned method used to fabricate this second conventional example, when the dielectric layer 106 is formed using, for example, the CVD method, the specific inductive capacity of the resulting CVD layer is high (5 to 9), therefore there is the problem that the noise factor (NF) is worsened because of the increase in the gate capacity.

In particular, because the resistance of the gate is lowered, in the case where the cross-section of the gate fine line 105 is T-shaped, there is a striking increase in the capacity of the gate because the sealing material is inserted between the lower section of a pent-roof 109 and the channel. Also, when the dielectric layer 106 functions as an insulating layer, the stress on the layer acts as shear stress on the surface of the chip by increasing the thickness of the insulating layer so that there is the problem of reduced reliability, such as cutting of the gate fine line 105 or the like.

As outlined above, with a ceramic seal used in a conventional semiconductor device for ultrahigh frequencies it is possible to minimize the deterioration of the characteristic, such as reduction of the noise factor (NF). in the high frequency band and reduction in gain and the like. However, on the other hand, the cost of parts is high, and an inspection of the cap seal and gas density and the like is required. For this reason, there is the drawback that the manufacturing costs are high because the production efficiency is low.

In addition, with molded sealing used as a countermeasure for the high cost of parts, it is necessary to cover the chip with a dielectric layer to guard against damage to the gate fine line. Because the specific inductive capacity is high, the noise factor is worsened from the increase in the gate capacity, and the stress on the layer acts as shear stress on the surface of the chip by increasing the thickness of the insulating layer so that there is the problem of reduced reliability, such as cutting of the gate fine line or the like.

SUMMARY OF THE INVENTION

Accordingly, an object of the present invention is, with due consideration to the drawbacks of such conventional semiconductor devices, to provide a semiconductor device wherein there is little worsening of the chip characteristics in the ultrahigh frequency band, the cost of manufacture is low, and high reliability is obtained.

In accordance with a preferred embodiment according to the present invention, a semiconductor device comprises:

an active layer formed on a semiconductor substrate with different types of junctions; a source region; a drain region;

a gate electrode for which the cross-sectional area of the upper surface is larger than that of the lower surface;

a first dielectric layer covering at least the exposed surface of said active layer, and said gate electrode; and a second dielectric layer enclosing said first dielectric layer, wherein when the specific inductive capacities of said first and second dielectric layers are $\epsilon(1)$ and $\epsilon(2)$ respectively $$\epsilon(1)<\epsilon(2)$$

and the water absorption ratio of said first dielectric layer is greater than the water absorption ratio of said second dielectric layer.

In accordance with another preferred embodiment of the present invention, in the semiconductor device described above, said first dielectric layer is fabricated from a fluororesin layer.

In the semiconductor device above, said second dielectric layer is fabricated from an epoxy resin layer.

In the semiconductor device above, the specific inductive capacity $\epsilon(1)$ of said first dielectric layer is 2.1 or less.

In the semiconductor device above, said first dielectric layer contacts and covers at least said gate electrode.

In the semiconductor device above, said first dielectric layer covers at least said gate electrode through an insulating layer of a thickness of 0.1 μm or less.

In the semiconductor device above, the semiconductor device is used in a high frequency band of 4 GHz or greater.

In a semiconductor device above, the insulating layer is made up of a SiN layer.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

Other features of this invention will become apparent in the course of the following description of exemplary embodiments which are given for illustration of the invention and are not intended to be limiting thereof.

An embodiment of the present invention will now be explained with reference to the drawings.

FIRST EMBODIMENT

Figure 1:
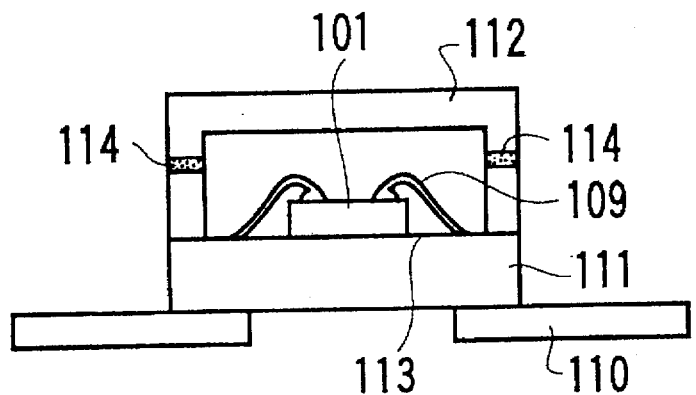
FIG. 1 is a sectional view showing the structure of a conventional semiconductor device (first conventional example).
Figure 2:
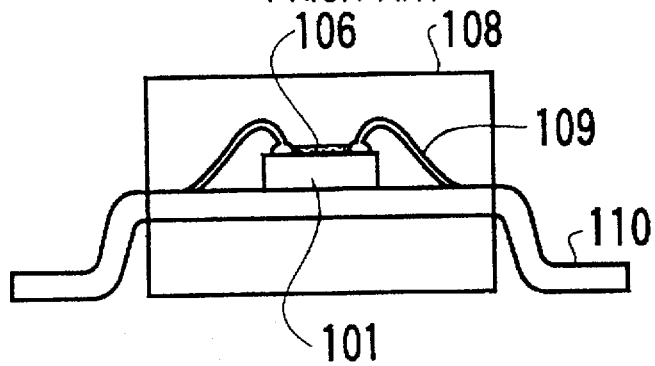
FIG. 2 is a sectional view showing the structure of a conventional semiconductor device (second conventional example) fabricated using a molded seal.
Figure 3:
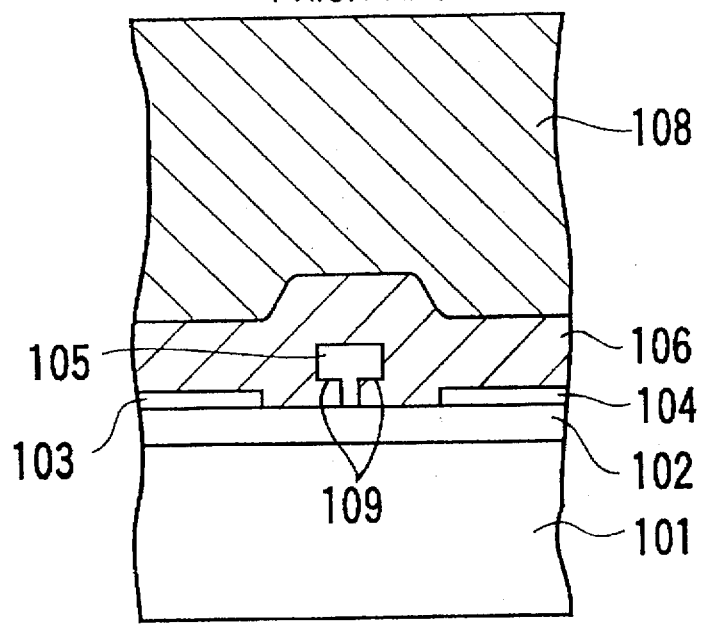
FIG. 3 is an expanded sectional view showing the vicinity of a gate fine line for the second conventional example.
Figure 4:
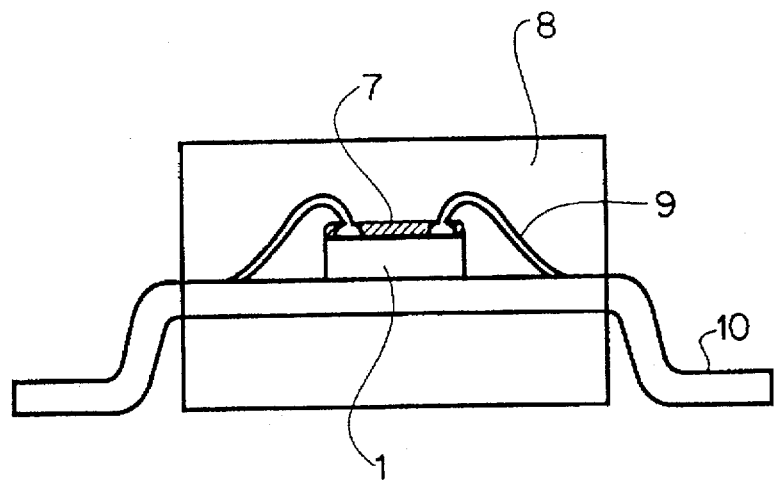
FIG. 4 is a sectional view showing the structure of a first embodiment of a semiconductor device of the present invention.
Figure 5:
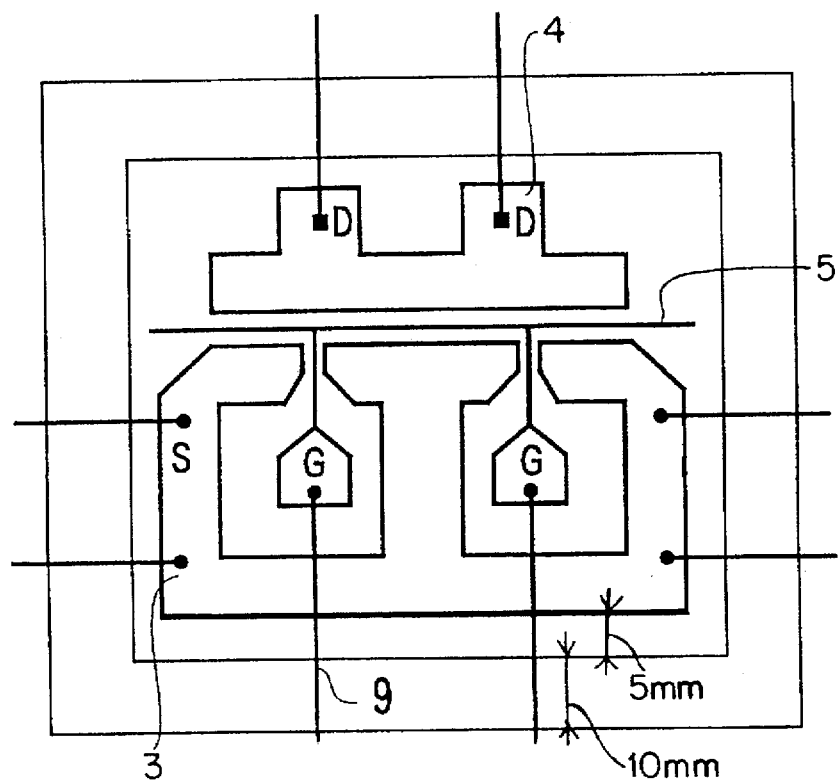
FIG. 5 is a sectional view showing the structure of the semiconductor device shown in FIG. 4 viewed from the top surface.
Figure 6:
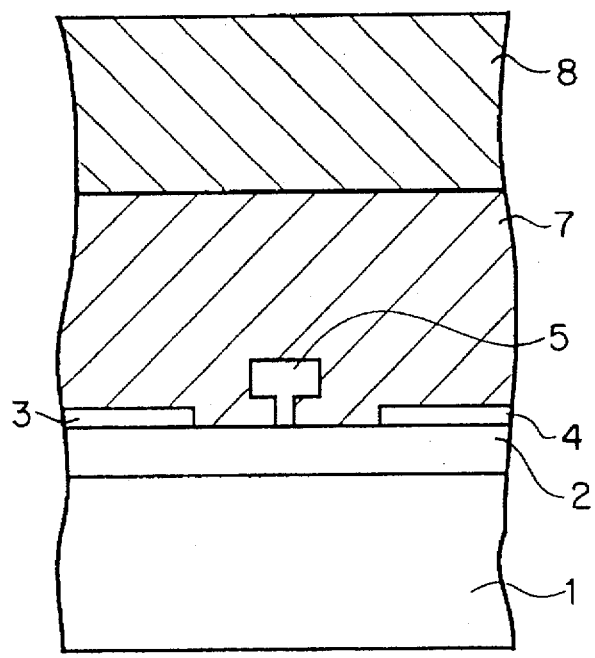
FIG. 6 is a detailed sectional view of the vicinity of a gate fine line of a semiconductor device of the present invention.

FIG. 4 and FIG. 5 are sectional views showing the structure of a semiconductor device of the present invention, and FIG. 6 is a detailed sectional view of the vicinity of a gate fine line of this semiconductor device.

FIG. 4 is a sectional view of an embodiment of a semiconductor chip, while FIG. 5 is a sectional view viewed from the top portion of the semiconductor device shown in FIG. 4.

The semiconductor device of this embodiment is an electric field effect type transistor provided with a molded resin seal type structure. The semiconductor device of this embodiment shown in FIGS. 4, 5 and 6 includes an active layer 2 formed on a semiconductor substrate 1, a source electrode 3, a drain electrode 4, and a gate fine line 5. The gate fine line 5 is provided with a T-shaped cross-section for which the cross-sectional area of the upper surface is larger than that of the lower surface, as shown in FIG. 6, in order to reduce the gate resistance.

A current channel section 12 of the active layer 2, the active layer 2, the source electrode 3, the drain electrode 4, and the gate fine line 5 are covered by a first dielectric layer 7.

A second dielectric layer 8 covers the first dielectric layer 7. This first dielectric layer 7 is formed from a fluorine-included resin (fluororesin) layer while the second dielectric layer 8 is formed from an epoxy resin material. The physical values of the first dielectric layer 7 and the second dielectric layer 8 are given below. The specific inductive capacities of the first and second dielectric layers 7, 8 are $\epsilon(1)$ and $\epsilon(2)$ respectively. The tangents of the dielectric loss angles of the first and second dielectric layers 7, 8 are tan $\delta(1)$ and tan $\delta(2)$ respectively. This embodiment is constructed so that the relationship between the specific inductive capacities of the first and second dielectric layers 7, 8 is $\epsilon(1)<\epsilon(2)$ and the relationship between the dielectric loss angles is tan $\delta(1)$ <tan $\delta(2)$. In addition, when the Young's modulus of the first and second dielectric layers 7, 8 are Y(1) and Y(2) respectively the relationship Y(1)<Y(2) is satisfied. The physical values of the fluorine-included resin (fluororesin) layer of the first dielectric layer 7 and the epoxy resin material of the second dielectric layer 8 are compared in the following table.

TABLE

| Material<br>Pallet<br>Periphery<br>Dielectrics | Physical Values | | | |
|---|---|---|---|---|
| | Dielectric<br>Constant | Tan δ | Water<br>Absorption<br>Ratio (%) | Noise Figure<br>NF |
| Fluorine-<br>included resin<br>(Fluororesin) | 2.1 | 0.0007 | 0.01 | 0.45 |
| Si gel resin | 3 | 0.005 | 2> | 0.55 |
| Polyimide resin | 3 | — | 1.0 | 0.55 |
| Epoxy resin | 3.27 | 0.016 | 1.5 | 0.65 |
| Air | 1 | 0 | — | 0.40 |

When the desired semiconductor device formed from the above materials is used in a high frequency range, the noise characteristics NF can be improved less than 0.55 dB and the value of gain Ga can be increased. In addition, with the desired semiconductor device the first dielectric layer 7 is formed from fluorine-included resin (fluororesin) and this fluorine-included resin (fluororesin) shows even better water resistance than the epoxy resin from which the second dielectric layer 8 is made. For this reason the electrode metal corrodes only with difficulty, therefore the longevity of the semiconductor device is improved. In particular, the gate fine line 5 is fabricated with a fine line of about 0.1 to 0.5 μm, and has the drawback of being easily corroded by the entry of water. However, external water and humidity can be prevented from entering by means of the first dielectric layer 7.

In addition, there is no generation of a migration phenomenon caused by electrode metals, so that there is no electrical short between electrodes.

SECOND EMBODIMENT

Figure 7:
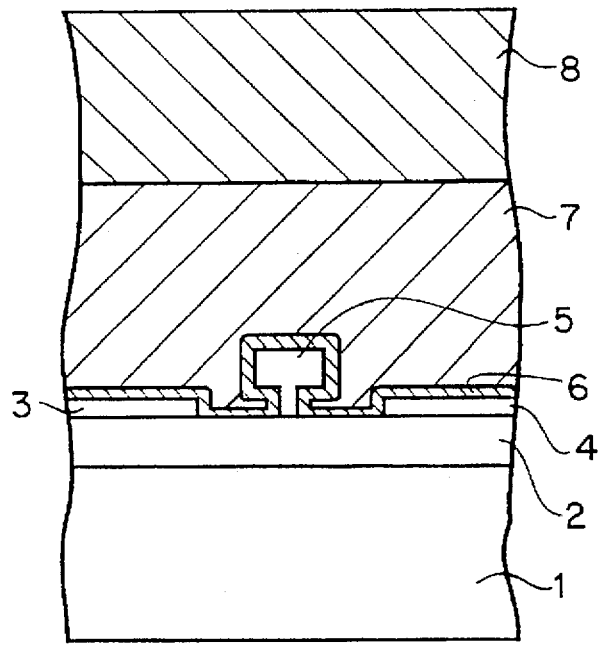
FIG. 7 is a sectional view showing the structure of a second embodiment of a semiconductor device of the present invention.

FIG. 7 is a sectional view showing the structure of a second embodiment of a semiconductor device of the present invention. This embodiment of the semiconductor device of the present invention has a source electrode 3 and a drain electrode 4 formed on the active layer 2, and an insulating layer 6 (in this embodiment, an SiN layer) formed between the gate fine line 5 and the first dielectric layer 7, of a thickness of 0.1 μm (1000 Å) or less. In all other respects this embodiment is identical to the first embodiment. Accordingly, the characteristics are also identical, therefore like reference numerals are used to designate identical or corresponding parts and further explanation is omitted here.

Figure 10:
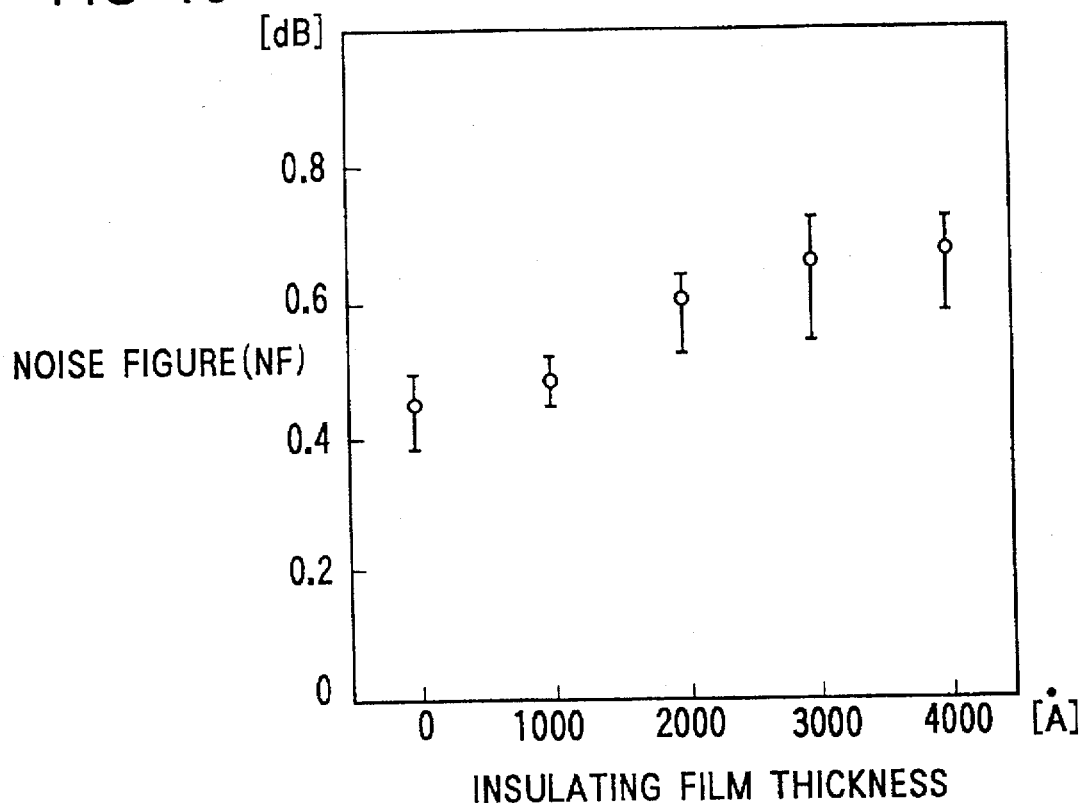
FIG. 10 is a diagram for explaining changes in the noise factor NF [db] versus the layer thickness [angstrom units] of an insulating layer (SiN layer) for a semiconductor device of the present invention.

In the semiconductor device of the second embodiment of the present invention with this configuration, because the thickness of the insulating layer 6 which covers with the gate fine wire 5 is approximately less than 1000 Å, as shown in FIG. 10, the noise factor NF is not increased. In addition, the water absorption ratio of the insulating layer 6 is less than that of the fluorine-included resin (fluororesin). Moreover, it is possible to obtain the semiconductor device in which the insulating layer 6 can prevent the influence of various solvents for the gate fine wire 5.

A first manufacturing method for the second embodiment of the present invention is as follows. The manufacturing method for the first embodiment of the present invention is identical to this method with the exception that no insulating layer 6 is formed, therefore no further explanation will be given.

(1) First, the source electrode 3, the drain electrode 4, and a T-shaped gate fine line or wire 5 are formed on the semiconductor substrate 1 on which the active layer 2 has been formed. The SiN layer 6 with a thickness of is then built up. The SiN layer 6 can prevent the influence of various chemicals such as solvents used in the following steps (2) to (4) for the gate file wire 5.

(2) Next, an opening for a bonding pad is provided, after which a bonding pad is formed from laminations of Au/Pt/Ti metal using the lift off method.

(3) Following this, wafer underside processing and dicing are carried out to form a chip, then frame mounting and bonding are performed.

(4) The fluorine included resin (fluororesin) 7 is then formed by applying a solvent containing a fluorine polymer to the chip, dropwise, baking in an oven at 150° C. for 60 minutes, then adding an appropriate encapsulating solvent by vaporization.

(5) Subsequently, the chip is sealed in the epoxy resin layer 8 using the transfer mold method.

Thereafter the lead is cut and the semiconductor device is completed via a series of shaping processes.

A second manufacturing method for the second embodiment of the present invention is as follows.

Steps (1) and (2) are performed to provide a bonding pad using the same method as in (1) and (2) of the first manufacturing method.

(3) A solvent containing a photosensitive fluorine-included polymer is applied to a wafer by spin-coating, then the solvent is vaporized by prebaking to form the fluorine-included resin (fluororesin) 7.

(4) Next, a bonding area is opened in the fluorine-included resin (fluororesin) 7 using photolithography.

(5) The chip is then sealed in the epoxy resin layer 8 using the transfer mold method, the lead is cut and the semiconductor device is completed via a series of shaping processes in the same manner as in the first manufacturing method.

With this embodiment of the semiconductor device formed by the above-described manufacturing methods, by covering the vicinity of the gate electrode 5 with the first dielectric layer 7 with a low dielectric constant (for example, specific inductive capacity $\epsilon=2.2$ or less) and a small tan δ of the peripheral dielectric (for example, tan $\delta=0.001$ or less), the gate capacity Cgs and the gate resistance Rg can be reduced, and the noise factor NF, approximated by the following equation, is reduced. Specifically it is possible to improve the noise characteristics.

$$NF=10 \log\{1+2\pi \times Kf \times f \times Cgs((Rs+Rg)/gm)^{1/2}\}$$

where Kf is a fitting factor; f is the frequency; Rs is the source resistance; and gm is the mutual conductance.

In addition, the resin (the first dielectric layer 7 formed from the fluorine-contained resin layer) interposed between the molded resin member (the second dielectric layer 8 formed from the epoxy resin member) and the chip becomes a barrier to protect against the filler. Also, the Young's modulus of the first dielectric layer 7 formed from the fluorine-included resin layer can be small so that it becomes a buffer for localized stress produced between the molded resin member and the chip. As a result, it is possible to improve the reliability of the semiconductor device.

Figure 8A:
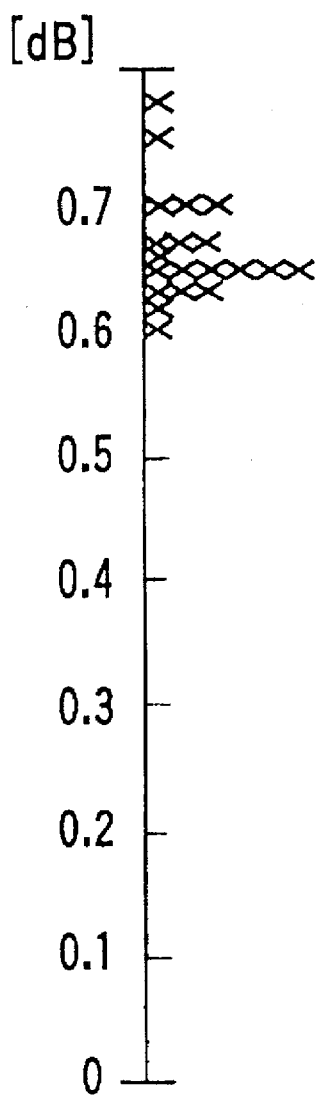
FIG. 8 is a diagram comparing the distribution of the noise factor NF [db] versus the frequency f=12 [GHz] for both a conventional example and a semiconductor device of the present invention.
Figure 8B:
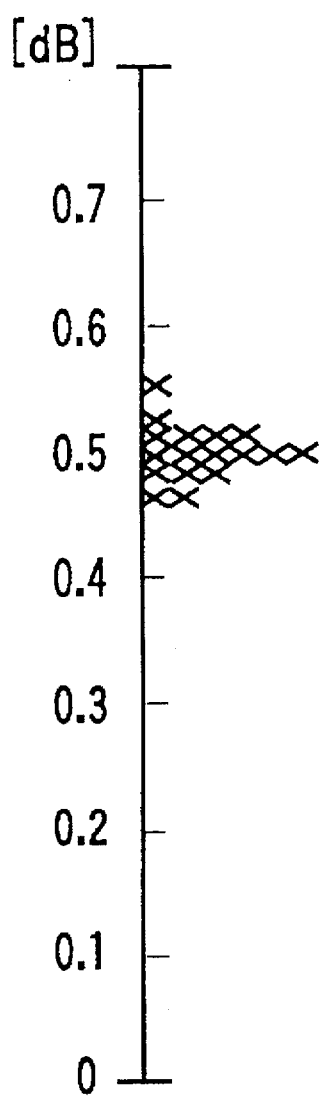
Figure 9:
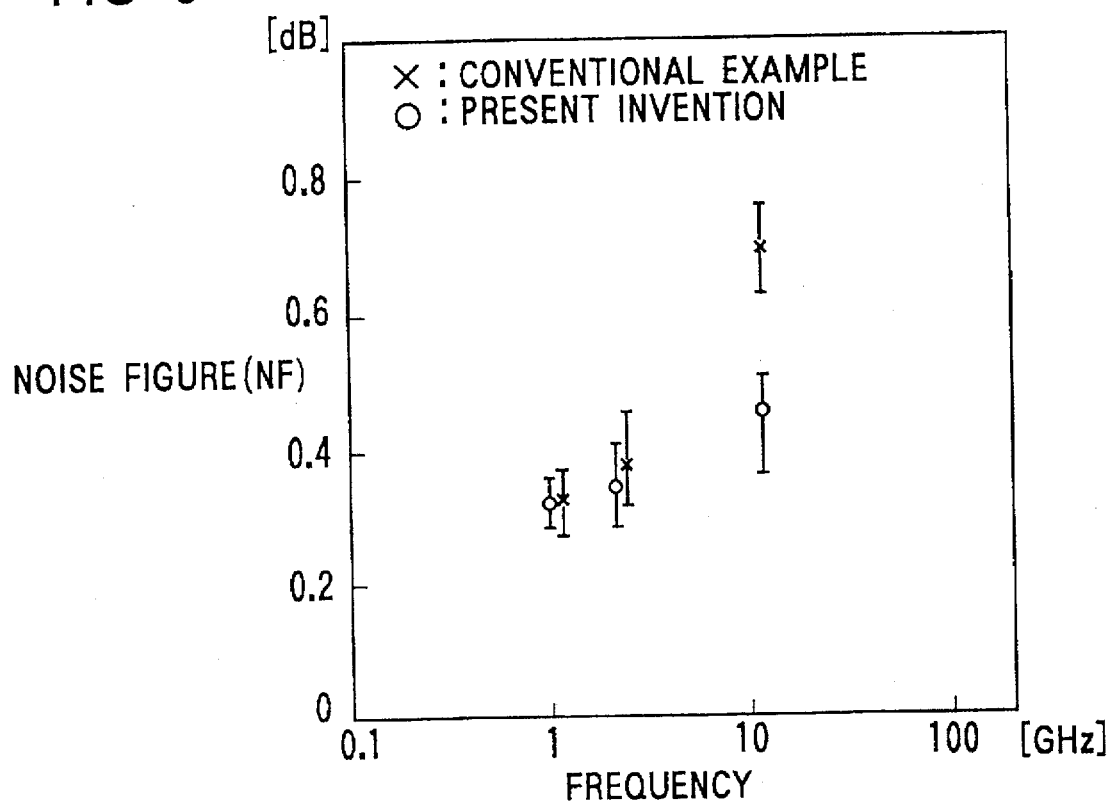
FIG. 9 is a noise characteristic diagram showing the noise factor NF [db] versus the frequency f=12 [GHz] for both a conventional example and a semiconductor device of the present invention.

FIGS. 8, 9 and 10 show actual results of physical values obtained using this embodiment of the semiconductor device of the present invention.

FIG. 8 is a diagram showing the distribution of the noise factor NF [db] versus the frequency f=12 [GHz](20 samples of each) for both a conventional example and an embodiment of a semiconductor device of the present invention. These results clearly show a reduction in the noise factor NF by the present invention.

FIG. 9 is a noise characteristic diagram showing changes in the noise factor NF [db] versus the frequency f [GHz] (5 samples of each) for both a conventional example and a semiconductor device of the present invention. These results clearly show that the improvement effect in the noise factor is very striking in an ultrahigh frequency band of 4 GHz or greater as a result of the present invention.

FIG. 10 shows changes in the noise factor NF [db] versus the layer thickness [angstrom units] of an insulating layer 6 (SiN layer) for a semiconductor device of the present invention. These results clearly illustrate that an SiN layer 6 of a thickness of 1000 Å or lower is suitable.

As outlined above, in the semiconductor device of the present invention which is of a type sealed with a molded resin, at least the current channel and the gate electrode are covered by a first dielectric layer. In addition, the first dielectric layer is enclosed in the second dielectric layer and the gate electrode is covered by the first dielectric layer (fluorine-included resin layer) with a low dielectric constant (for example, specific inductive capacity $\epsilon(1)=2.2$ or less) and a small tangent for the dielectric loss angle (for example, tan $\delta(1)=0.001$ or less) therefore the gate capacity and gate resistance can be lowered and the noise factor NF is reduced. In particular, it is possible to provide a semiconductor device with good noise characteristics in an ultrahigh frequency band.

In addition, because the water absorption ratio of the first dielectric layer is less than that of the fluorine-included resin layer and that of the second dielectric layer, the semiconductor device can obtain a strong waterproof feature.

Furthermore, the first dielectric layer (fluorine-included resin layer) interposed between the second dielectric layer (epoxy resin layer) and the chip becomes a protective barrier against the filler contained in the second dielectric layer, and, in particular, by reducing the Young's modulu of the first dielectric layer, this layer becomes a buffer for localized stress produced between the second dielectric layer and the chip. As a result, it is possible to provide a semiconductor device of high reliability.

Also, the first dielectric layer covers at least the gate electrode through an insulating layer of a thickness of 0.1 µm or less, therefore deterioration of the characteristics during the manufacturing process can be prevented.

What is claimed is:

1. A high frequency semiconductor device comprising:
    an active layer formed on a semiconductor substrate with different types of junctions;
    a source region;
    a drain region;
    a gate electrode having a cross-sectional area of an upper surface which is larger than a cross-sectional area of a lower surface;
    a third layer formed on said active layer, said source region, said drain region, and said gate electrode;
    a first dielectric layer formed on said third layer;
    a second dielectric layer formed on said first dielectric layer; and
    wherein a specific inductive capacity $\epsilon(1)$ of the first dielectric layer is less than a specific inductive capacity $\epsilon(2)$ of the second dielectric layer at the high frequency and a water absorption ratio of said first dielectric layer is greater than a water absorption ratio of said second dielectric layer.

2. A semiconductor device as claimed in claim 1, wherein said first dielectric layer is fabricated from a fluororesin layer.

3. A semiconductor device as claimed in claim 1, wherein said second dielectric layer is fabricated from an epoxy resin layer.

4. A semiconductor device as claimed in claim 1, wherein the specific inductive capacity $\epsilon(1)$ of said first dielectric layer is 2.1 or less.

5. A semiconductor device as claimed in claim 1, wherein said semiconductor device is used in a high frequency band of 4 GHz or greater.

6. A semiconductor device as claimed in claim 1, wherein the third layer is formed by an insulating layer, a thickness of which is 0.1 µm or less.

7. A semiconductor device as claimed in claim 2, wherein said second dielectric layer is fabricated from an epoxy resin layer.

8. A semiconductor device as claimed in claim 2, wherein the specific inductive capacity $\epsilon(1)$ of said first dielectric layer is 2.1 or less.

9. A semiconductor device as claimed in claim 2, wherein said semiconductor device is used in a high frequency band of 4 GHz or greater.

10. A semiconductor device as claimed in claim 3, wherein the specific inductive capacity $\epsilon(1)$ of said first dielectric layer is 2.1 or less.

11. A semiconductor device as claimed in claim 3, wherein said semiconductor device is used in a high frequency band of 4 GHz or greater.

12. A semiconductor device as claimed in claim 6, wherein said insulating layer comprises a SiN layer, a thickness of said SiN layer being 0.1 µm or less.

13. A semiconductor device comprising:
    an active layer formed on a semiconductive substrate with different types of junctions;
    a source region;
    a drain region;
    a gate electrode having a cross-sectional area of an upper surface which is larger than a cross-sectional area of a lower surface;
    a SiN layer of a thickness of 0.1 µm or less formed on said active layer, said source region, said drain region, and said gate electrode;
    a fluororesin layer of a specific inductive capacity $\epsilon(1)$ equal to 2.1 or less formed on said SiN layer;
    an epoxy resin layer of a specific inductive capacity $\epsilon(2)$ which is greater than $\epsilon(1)$ formed on said fluororesin layer; and
    wherein a water absorption ratio of said fluororesin layer is greater than a water absorption ratio of said epoxy resin layer.

* * * * *